(12) United States Patent
Kobayashi et al.

(10) Patent No.: US 7,158,435 B2
(45) Date of Patent: Jan. 2, 2007

(54) FUSE CIRCUIT AND SEMICONDUCTOR INTEGRATED CIRCUIT DEVICE

(75) Inventors: Hiroyuki Kobayashi, Kawasaki (JP); Toshiya Uchida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/091,455

(22) Filed: Mar. 29, 2005

(65) Prior Publication Data
US 2005/0169071 A1    Aug. 4, 2005

Related U.S. Application Data

(63) Continuation of application No. PCT/JP03/05962, filed on May 13, 2003.

(51) Int. Cl.
*G11C 17/18* (2006.01)
(52) U.S. Cl. .............................. 365/225.7; 365/189.09; 365/200
(58) Field of Classification Search ............. 365/225.7, 365/194, 200, 96, 189.09
See application file for complete search history.

(56) References Cited

U.S. PATENT DOCUMENTS 6,021,067 A   2/2000   Ha 6,469,923 B1 *  10/2002  Hidaka ........................ 365/149
6,980,408 B1 *  12/2005  Sakihama et al. .......... 361/91.1
2005/0052218 A1 *  3/2005  Killian et al. ............... 327/525

FOREIGN PATENT DOCUMENTS

| JP | 56-33853 A | 4/1981 |
|---|---|---|
| JP | 60-182219 A | 9/1985 |
| JP | 63-217600 A | 9/1988 |
| JP | 1-184861 A | 7/1989 |
| JP | 2-168500 A | 6/1990 |
| JP | 3-272098 A | 12/1991 |
| JP | 5-326714 A | 12/1993 |
| JP | 11-283389 | 10/1999 |

* cited by examiner

*Primary Examiner*—Son T. Dinh
*Assistant Examiner*—Hien N Nguyen
(74) *Attorney, Agent, or Firm*—Arent Fox PLLC

(57) ABSTRACT

A fuse circuit has an actual fuse circuit block and a fuse monitor circuit. The actual fuse circuit block stores fuse information; on the other hand, the fuse monitor circuit monitors whether a supply voltage has reached an information capturable voltage at which the fuse information from the actual fuse circuit block can be correctly captured.

27 Claims, 13 Drawing Sheets

FUSE CIRCUIT AND SEMICONDUCTOR INTEGRATED CIRCUIT DEVICE

CROSS-REFERENCE TO RELATED APPLICATION

This application is a continuation application and is based upon PCT/JP03/05962, filed on May 13, 2003.

BACKGROUND OF THE INVENTION

1. Field of the Invention

The present invention relates to a fuse circuit and a semiconductor integrated circuit device and, more particularly, to a fuse circuit used at low voltage and a semiconductor integrated circuit device.

2. Description of the Related Art

A fuse circuit, with a fuse which may be blown or not blown as desired, is used for various internal processing or specification setting purposes in a semiconductor integrated circuit device and, for example, to implement redundancy to replace a defective cell in a DRAM (Dynamic Random Access Memory), or to customize a general-purpose DRAM to have a data width or a memory organization (for example, ×8, ×16, or ×32) that meets the user's needs. Information of the fuse circuit is read when power is applied to the semiconductor integrated circuit device (i.e., at power on).

Generally, the fuse characteristic is such that the information is reset to the blown state side of the fuse and, by a fuse set signal. The information is inverted to the unblown state side when the fuse is not blown, but remains at the blown state side when the fuse is blown.

However, in the fuse circuit having such a characteristic, the following problem occurs when operating at a low voltage. That is, the lower the voltage at which the fuse circuit is used, the more likely it is that the fuse will be judged to be in the blown state (because of a reduced capability to invert), resulting in the possibility of erroneous information reading. Further, in a circuit that latches the information, as latching at a low voltage is unstable, the information may not be latched correctly.

In the prior art, there is proposed a fuse cell sensing circuit for a flash memory, which is designed to reliably latch fuse cell data, at power on, to a memory cell by determining, using a reference circuit, the setup time for sensing and latching the fuse cell data at power on to the memory cell, and by having the reference circuit track the sensing time that changes due to changes in process (refer, for example, to Patent Document 1).

Patent Document 1

Japanese Unexamined Patent Publication (Kokai) No. 11-283389

SUMMARY OF THE INVENTION

The present invention has been devised in view of the above-described problem of the prior art and an object of the invention is to provide a fuse circuit and a semiconductor integrated circuit device that can correctly capture fuse information even at low operating voltage and can also achieve reliable latching by a latch circuit.

According to a first aspect of the present invention, there is provided a fuse circuit comprising: an actual fuse circuit block for storing fuse information; and a fuse monitor circuit for monitoring whether a supply voltage has reached an information capturable voltage at which the fuse information from the actual fuse circuit block can be correctly captured.

According to a second aspect of the present invention, there is provided a semiconductor integrated circuit device comprising: an actual fuse circuit block for storing fuse information; a starter signal generating circuit for generating a starter signal that is used to capture the fuse information when power is turned on; a fuse monitor circuit for monitoring whether a supply voltage has reached an information capturable voltage at which the fuse information from the actual fuse circuit block can be correctly captured; and a pulse signal generating circuit for generating a capture signal from an output signal of the fuse monitor circuit, wherein the actual fuse circuit block receives the capture signal from the pulse signal generating circuit and the starter signal, and thereby outputs the fuse information.

BRIEF DESCRIPTION OF THE DRAWINGS

The present invention will be described below with reference to the accompanying drawings, wherein.

DESCRIPTION OF THE PREFERRED EMBODIMENTS

Before describing a fuse circuit and a semiconductor integrated circuit device according to an embodiment of the present invention, a fuse circuit and a semiconductor integrated circuit device according to the prior art and their associated problem will be described in detail with reference to the accompanying drawings (FIGS. 1 to 7).

Figure 1:
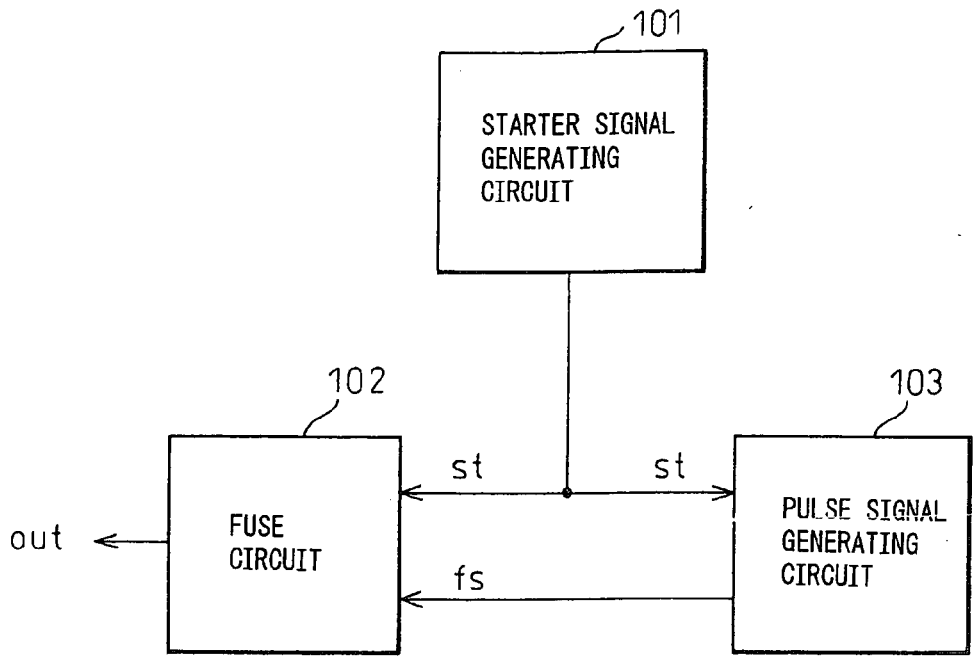
FIG. 1 is a block diagram schematically showing one example of a prior art semiconductor integrated circuit device (a fuse circuit and its peripheral circuits)

FIG. 1 is a block diagram schematically showing one example of the prior art semiconductor integrated circuit device (the fuse circuit and its peripheral circuits).

As shown in FIG. 1, the prior art semiconductor integrated circuit device (the fuse circuit and its peripheral circuits) comprises a starter signal generating circuit 101, a fuse circuit 102, and a pulse signal generating circuit 103. The semiconductor integrated circuit device here is, for example, a DRAM, and the fuse circuit 102 is used, for example, to store information (address information of a defective cell) for implementing redundancy to replace a defective cell in a DRAM, or to store information, etc. for customizing a general-purpose DRAM to have a data width or a memory organization (for example, ×8, ×16, or ×32) that meets the user's needs.

Figure 2:
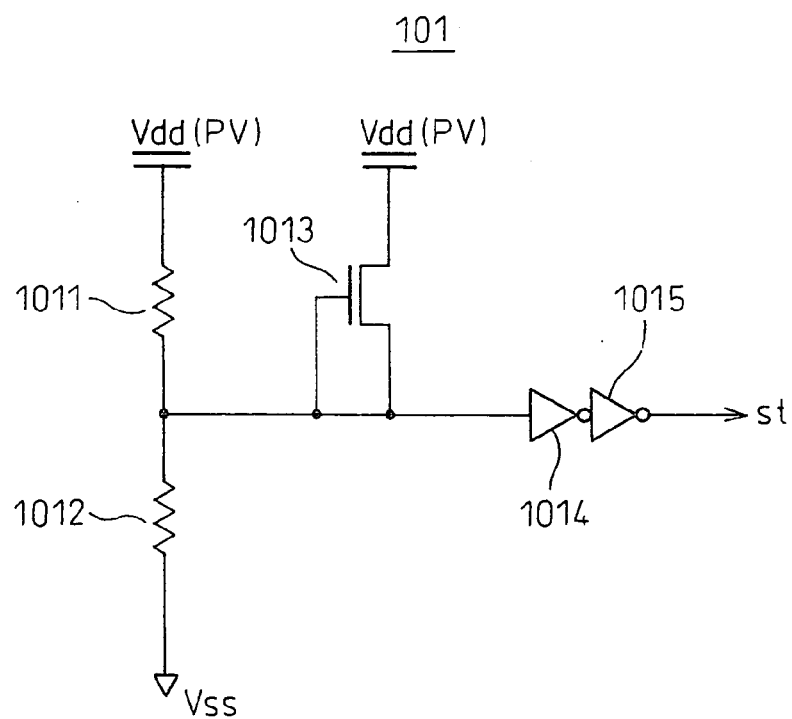
FIG. 2 is a circuit diagram showing one example of a starter signal generating circuit in the semiconductor integrated circuit device of FIG. 1.

FIG. 2 is a circuit diagram showing one example of the starter signal generating circuit in the semiconductor integrated circuit device of FIG. 1.

As shown in FIG. 2, the starter signal generating circuit 101 comprises resistors 1011 and 1012, an n-channel MOS transistor (nMOS transistor) 1013, and inverters 1014 and 1015. The operation of the starter signal generating circuit 101 is such that, during the process in which power is turned on to the semiconductor integrated circuit device and the actual supply voltage PV gradually rises from a low-level supply voltage Vss (0 v) up to a high-level supply voltage (steady-state supply voltage) Vdd, the starter signal generating circuit 101 first outputs a signal st which is held at the low-level supply voltage Vss and, in this condition, when the actual supply voltage PV becomes higher than the voltage divided through the resistors 1011 and 1012 and applied to the gate of the nMOS transistor 1013, and exceeds the threshold voltage (Vth) of the transistor 1013, the transistor 1013 turns on and the starter signal st, whose waveform includes the rising portion of the supply voltage (see FIG. 5), is output.

Figure 3:
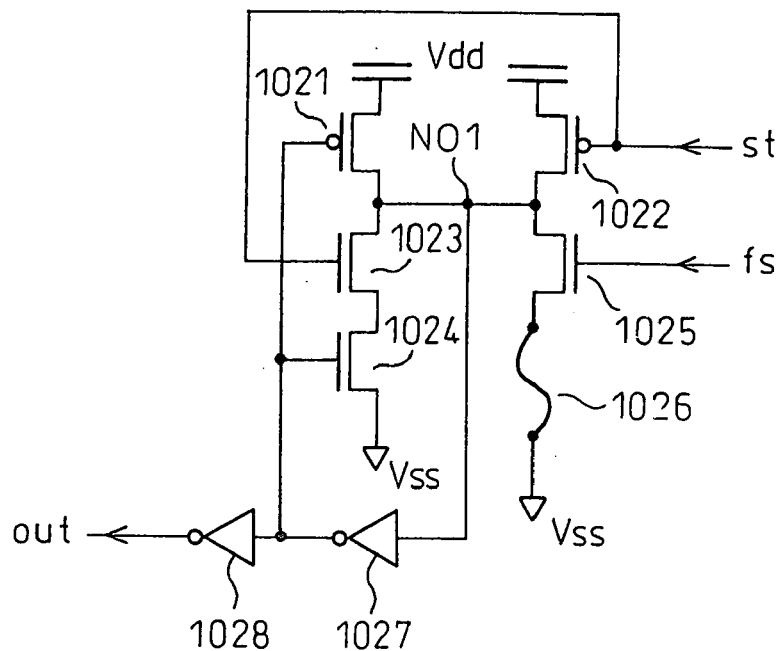
FIG. 3 is a circuit diagram showing one example of the fuse circuit in the semiconductor integrated circuit device of FIG. 1.

FIG. 3 is a circuit diagram showing one example of the fuse circuit in the semiconductor integrated circuit device of FIG. 1.

As shown in FIG. 3, the fuse circuit 102 comprises p-channel MOS transistors (pMOS transistors) 1021 and 1022, n-channel MOS transistors (nMOS transistors) 1023, 1024, and 1025, a fuse 1026, and inverters 1027 and 1028. Here, a series circuit consisting of the pMOS transistor 1021 and the nMOS transistors 1023 and 1024 and a series circuit consisting of the pMOS transistor 1022, the nMOS transistor 1025, and the fuse 1026 are each connected in series between the high-level power supply line (Vdd) and the low-level power supply line (Vss) across which the supply voltage PV is applied.

The gates of the PMOS transistor 1022 and nMOS transistor 1023 are supplied with the starter signal st, while the gate of the nMOS transistor 1025 is supplied with a capture signal fs. Further, a signal taken from a common connection node NO1 between a node connecting the pMOS transistor 1022 and nMOS transistor 1025 and a node connecting the pMOS transistor 1021 and nMOS transistor 1023 is supplied via the inverter 1027 to the gates of the transistors 1021 and 1024; the signal is also output as an output signal "out" via the inverter 1028.

Figure 4:
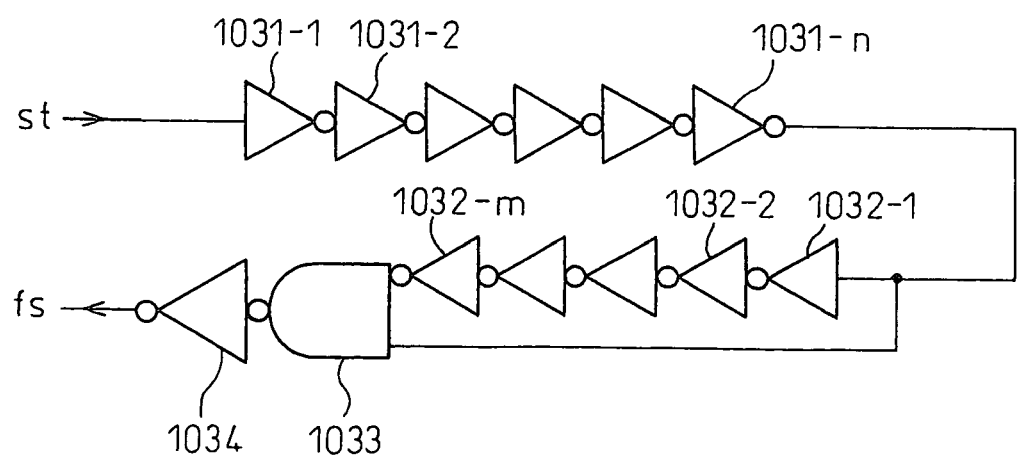
FIG. 4 is a circuit diagram showing one example of a pulse signal generating circuit in the semiconductor integrated circuit device of FIG. 1.

FIG. 4 is a circuit diagram showing one example of the pulse signal generating circuit in the semiconductor integrated circuit device of FIG. 1.

As shown in FIG. 4, the pulse signal generating circuit 103 comprises a plurality (even number) of inverters 1031-1 to 1031-n, a plurality (odd number) of inverters 1032-1 to 1032-m, a NAND gate 1033, and an inverter 1034. Here, the inverters 1031-1 to 1031-n are provided to give a delay time dt1, while the inverters 1032-1 to 1032-m are provided to give a pulse width dt2 in the capture signal fs, as shown in FIG. 5 described hereinafter.

Figure 5:
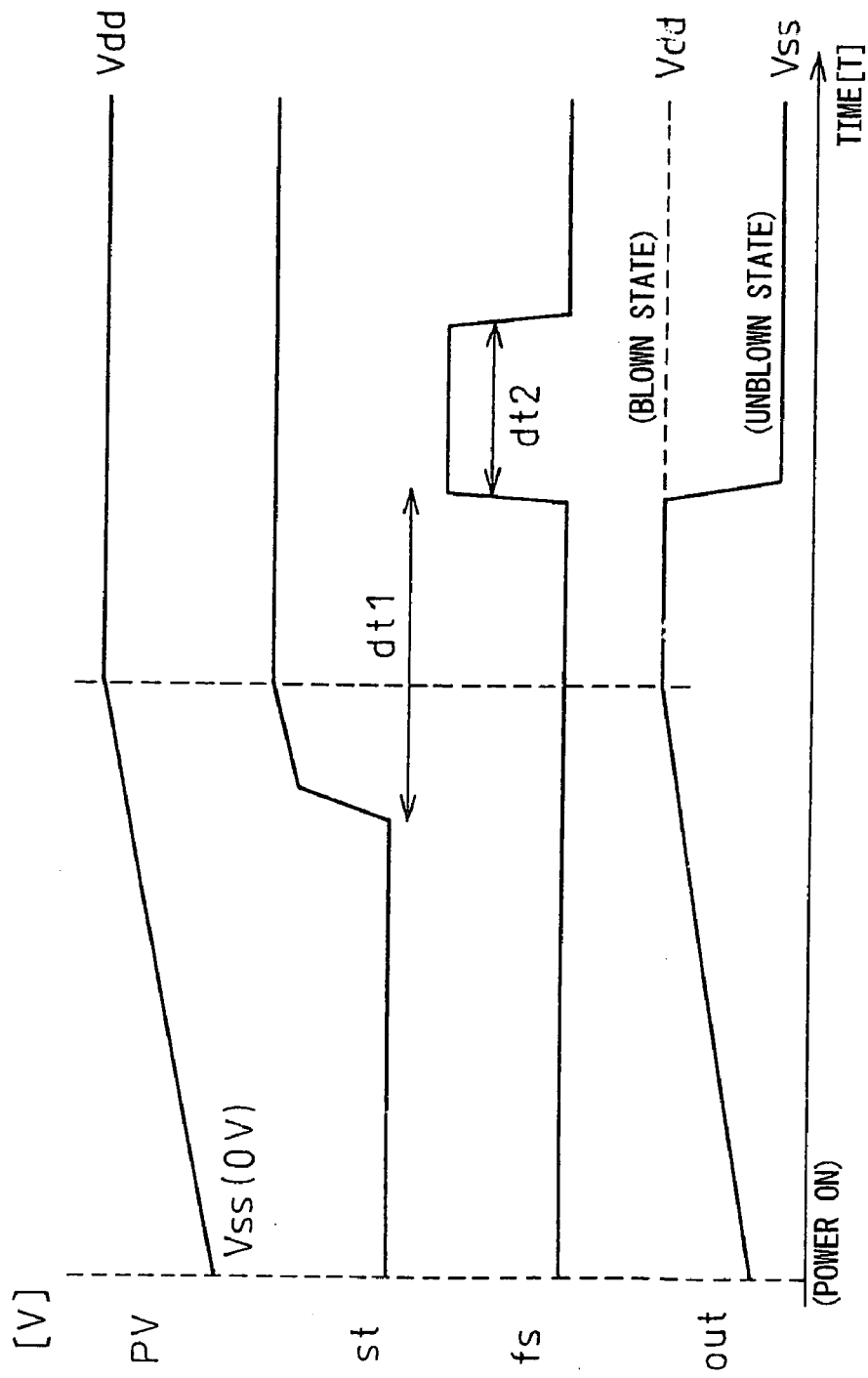
FIG. 5 is a waveform diagram for explaining the operation of the semiconductor integrated circuit device of FIG. 1.

FIG. 5 is a waveform diagram for explaining the operation of the semiconductor integrated circuit device of FIG. 1.

As shown in FIGS. 5 and 3, first, when power is turned on to the semiconductor integrated circuit device, the actual supply voltage PV gradually rises from Vss (0 V) and finally settles at the steady-state supply voltage Vdd; during this process, the starter signal st (or a signal equivalent to the starter signal) changes from a low level "L" to a high level "H". That is, the starter signal st, which is supplied to the gates of the transistors 1022 and 1023, is first at the low level "L" (Vss). Then, when the actual supply voltage PV becomes higher than the voltage divided through the resistors 1011 and 1012 and exceeds the threshold voltage (Vth) of the transistor 1013, as previously described, the starter signal st goes to the high level "H" (substantially Vdd, though the waveform includes more or less the rising portion of the supply voltage), causing the transistor 1023 to turn on and the transistor 1022 to turn off.

As a result, the output signal "out" goes to the high level "H" (Vdd). This state is the same as the blown state of the fuse 1026. Thereafter, the transistor 1025 is turned on by the high level "H" pulse in the capture signal fs; here, if the fuse 1026 is not blown, the output signal "out" is inverted to the low level "L" (Vss) (unblown state) and held at that state, but if the fuse 1026 is blown, the output signal "out" remains at the high level "H" state (blown state).

In this way, in the prior art fuse circuit, the signal is usually reset to the blown state, and fuse information is captured by inverting it to the unblown state.

Figure 6:
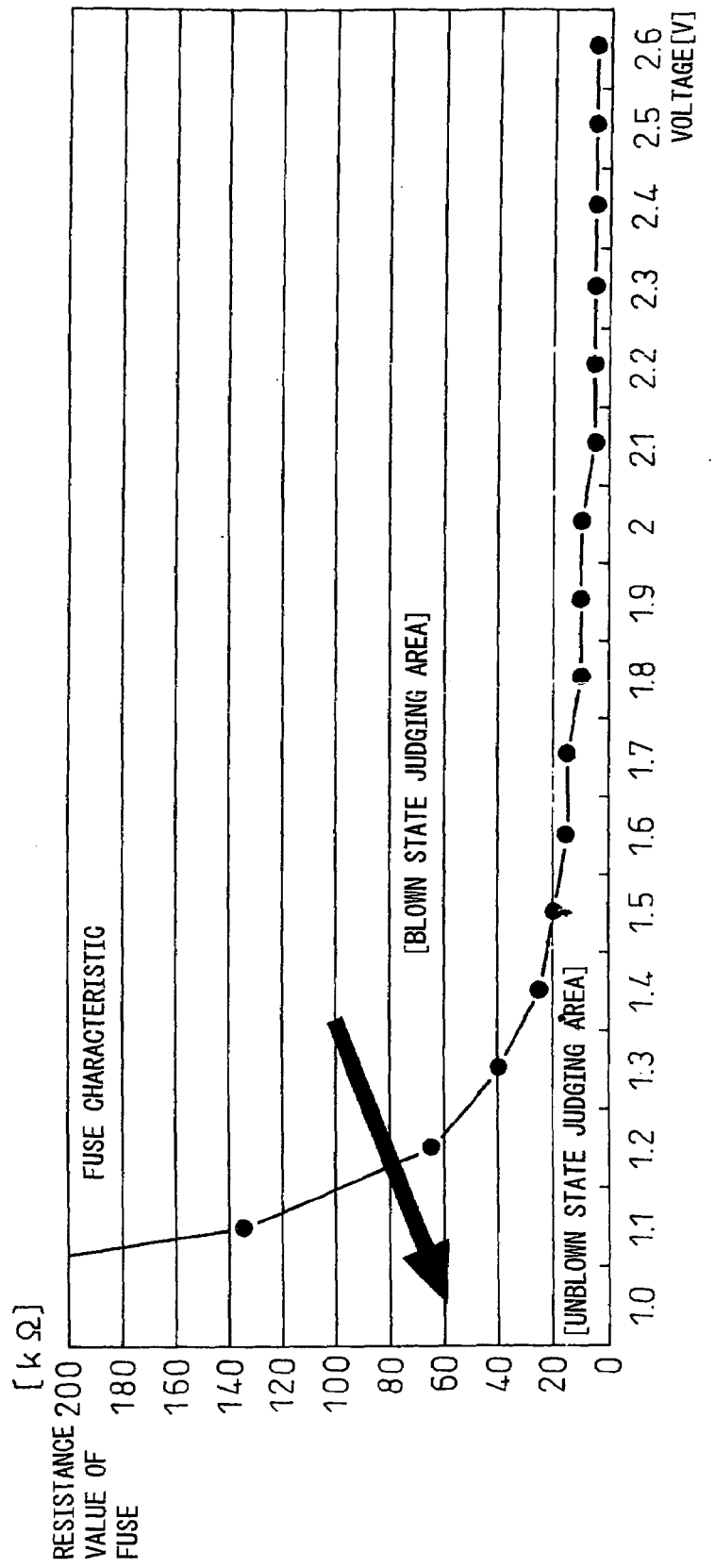
FIG. 6 is a diagram showing the fuse characteristic of the fuse circuit of FIG. 3.

FIG. 6 is a diagram showing the fuse characteristic of the fuse circuit of FIG. 3; here, the vertical axis represents the resistance value [kΩ] of the fuse, and the horizontal axis represents the voltage (operating voltage) [V].

As can be seen from FIG. 6, in the case of the prior art fuse circuit, the curve defining the boundary between a blown state judging area, where the fuse is judged to be in a blown state, and an unblown state judging area, where the fuse is judged to be not blown (unblown state), shows the characteristic that the resistance value of the fuse increases sharply when the operating voltage decreases (for example, to about 1.2 V or below). Here, the output "out" of the fuse circuit remains unchanged when the fuse is blown, but changes when the fuse is not blown, and the direction of the fuse operation is as shown by an arrow in FIG. 6.

In this way, in the prior art fuse circuit, as the operating voltage becomes lower, the fuse becomes more likely to be judged to be not blown. Accordingly, in such situations as when the blowing of the fuse is insufficient, or when fuse growback occurs (growback: a phenomenon in which the resistance value of the fuse portion begins to decrease, though the fuse has been blown), the possibility of erroneously reading the fuse information increases. This problem has become more serious in recent years because of the need for lower power consumption, higher operating speed, etc.

requiring further reduction in the supply voltage of the semiconductor integrated circuit device.

Figure 7:
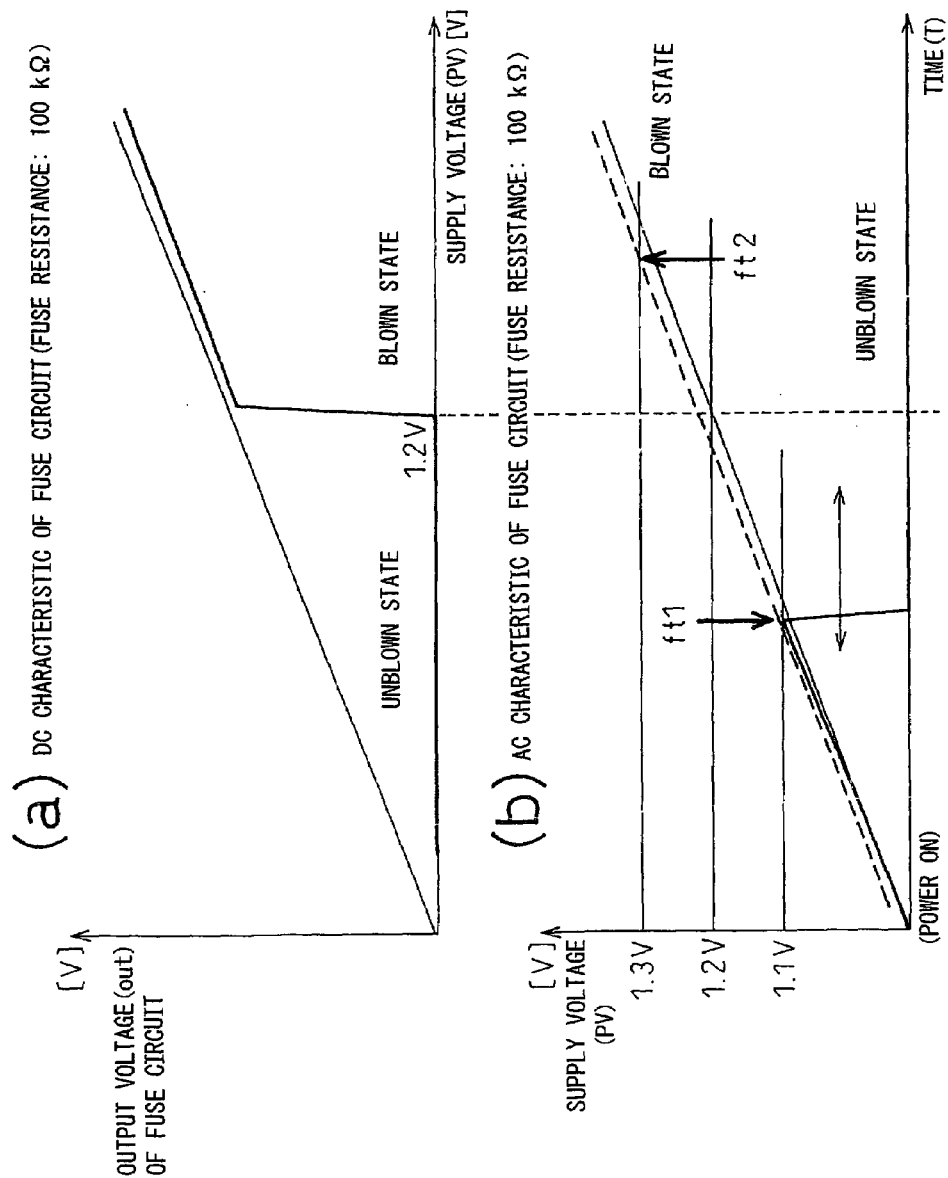
FIG. 7 is a diagram showing the DC characteristic and AC characteristic of the prior art fuse circuit.

FIG. 7 is a diagram showing the DC characteristic and AC characteristic of the prior art fuse circuit. FIG. 7(a) shows the relationship between the supply voltage (operating voltage VP) and the output voltage of the fuse circuit (the DC characteristic of the actual fuse characteristic as viewed in terms of direct current) for the case where the fuse is blown but the fuse exhibits a resistance value of 100 kΩ, for example, due to the fuse growback described above; on the other hand, FIG. 7(b) shows the relationship between the voltage of the capture signal st and the time (the AC characteristic of the actual fuse characteristic as viewed in terms of alternating current) when power is turned on and the operating voltage VP rises from 0 V to Vdd, likewise, for the case where the fuse is blown but the fuse exhibits a resistance value of 100 kΩ. FIG. 7 here deals with the case where the boundary between the blown state judging area and the unblown state judging area is crossed when the operating voltage is 1.2 V and the fuse resistance value is 100 kΩ.

More specifically, as shown in FIG. 7(a), according to the DC characteristic of the fuse circuit, the fuse is judged to be in a blown state or in an unblown state, depending on whether the actual supply voltage (operating voltage) PV is not lower than 1.2 V. That is, even when the fuse is blown, if the fuse resistance value is 100 kΩ due to growback or the like, then if the actual supply voltage PV is lower than 1.2 V, the fuse circuit outputs a low level "L" by judging that the fuse is not blown.

Further, as shown in FIG. 7(b), according to the AC characteristic of the fuse circuit, during the process in which power is turned on to the semiconductor integrated circuit device containing the fuse circuit and the actual supply voltage PV gradually rises from the low-level supply voltage Vss (0 V) up to the high-level supply voltage (steady-state supply voltage) Vdd, for example, if the fuse information is captured at time ft1 (for example, when PV=1.1 V) before the actual supply voltage PV reaches 1.2 V, and if, at this time, the fuse resistance value is 100 kΩ due to growback or the like, erroneous fuse information will be captured (the fuse circuit outputs a low level "L") by judging that the fuse is not blown, even when the fuse is blown. That is, it can be seen that when the resistance of the blown fuse is 100 kΩ, if the fuse information is to be captured correctly, the fuse information must be captured at time t2 (for example, when PV=1.3 V) after the actual supply voltage PV has exceeded 1.2 V.

A fuse circuit and a semiconductor integrated circuit device according to an embodiment of the present invention will be described in detail below with reference to the accompanying drawings.

Figure 8:
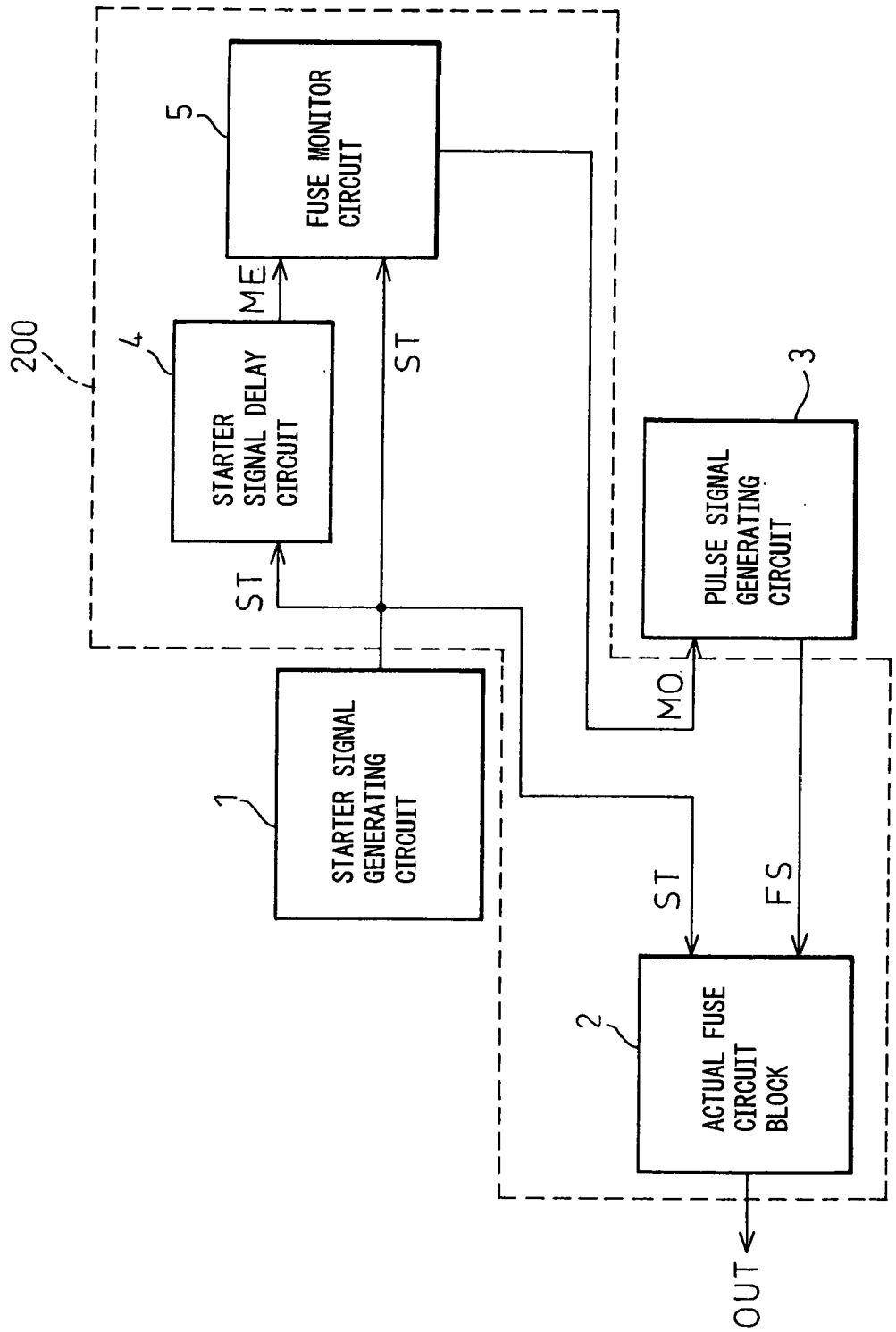
FIG. 8 is a block diagram schematically showing one example of a semiconductor integrated circuit device (a fuse circuit and its peripheral circuits) according to the present invention.

FIG. 8 is a block diagram schematically showing one example of the semiconductor integrated circuit device (the fuse circuit and its peripheral circuits) according to the present invention.

As shown in FIG. 8, the semiconductor integrated circuit device (the fuse circuit and its peripheral circuits) according to the present invention comprises a starter signal generating circuit 1, the fuse circuit 200, and a pulse signal generating circuit 3. As is apparent from a comparison of FIG. 8 and previously given FIG. 1, the fuse circuit 200 of the present invention corresponds to the fuse circuit 102 in the prior art, and comprises an actual fuse circuit block 2 which actually stores information, a starter signal delay circuit 4, and a fuse monitor circuit 5. The actual fuse circuit block 2 has the same circuit configuration as that of the prior art fuse circuit 102. The semiconductor integrated circuit device here is, for example, a DRAM and, like the prior art, the fuse circuit 200 is used, for example, to store information for implementing redundancy to replace a defective cell in a DRAM, or to store information, etc. for customizing a general-purpose DRAM to have a data width or a memory organization (for example, ×8, ×16, or ×32) that meets the user's needs.

Figure 9:
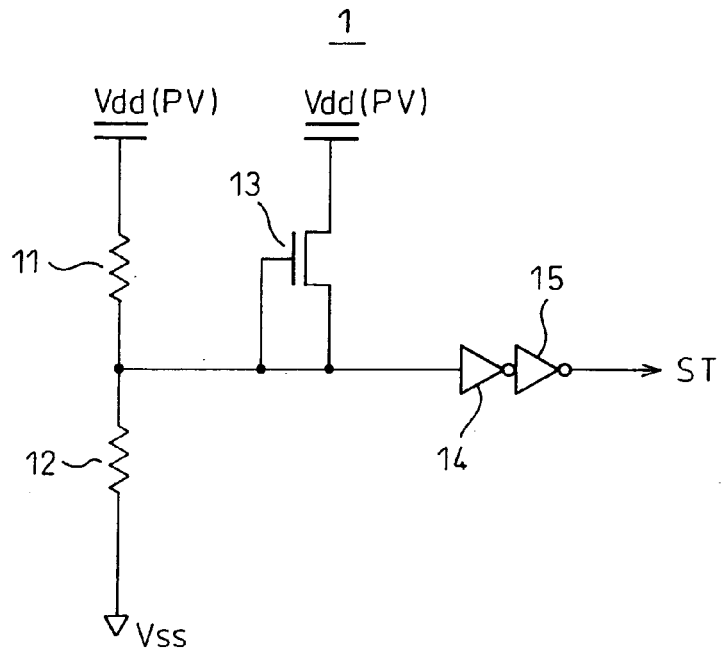
FIG. 9 is a circuit diagram showing one example of a starter signal generating circuit in the semiconductor integrated circuit device of FIG. 8.

FIG. 9 is a circuit diagram showing one example of the starter signal generating circuit in the semiconductor integrated circuit device of FIG. 8. The starter signal generating circuit 1 of the present embodiment shown in FIG. 9 has the same circuit configuration as that of the prior art starter signal generating circuit 101 previously shown in FIG. 2.

That is, as shown in FIG. 9, the starter signal generating circuit 1 comprises resistors 11 and 12, an nMOS transistor 13, and inverters 14 and 15 and, during the process in which power is turned on to the semiconductor integrated circuit device and the actual supply voltage PV gradually rises from the low-level supply voltage Vss up to the high-level supply voltage Vdd, the starter signal generating circuit 101 outputs a starter signal ST (see FIG. 14) having a prescribed waveform (similar to that of the starter signal st in the prior art).

Figure 10:
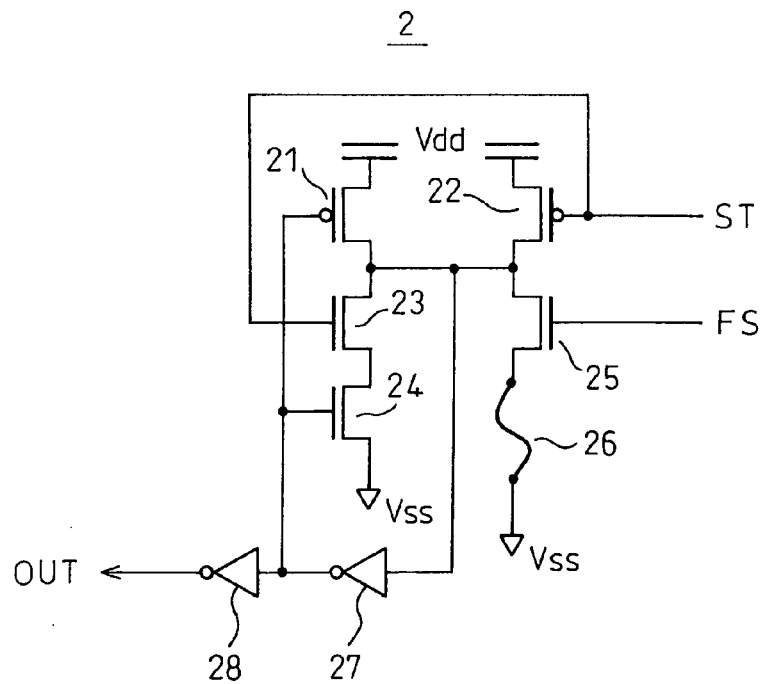
FIG. 10 is a circuit diagram showing one example of an actual fuse circuit block in the semiconductor integrated circuit device of FIG. 8.

FIG. 10 is a circuit diagram showing one example of the actual fuse circuit block in the semiconductor integrated circuit device of FIG. 8.

As is apparent from a comparison of FIG. 10 and previously given FIG. 3, the actual fuse circuit block 2 of the present embodiment has the same circuit configuration as that of the prior art fuse circuit 102, and comprises pMOS transistors 21 and 22, nMOS transistors 23, 24, and 25, a fuse 26, and inverters 27 and 28. As can be seen, in the actual fuse circuit block 2 of the present embodiment, the signal (capture signal FS) equivalent to the capture signal fs input to the prior art fuse circuit 102 of FIG. 3 is produced by supplying a signal (MO) processed through the newly added circuits (the starter signal generating circuit 4 and the fuse monitor circuit 5) to the pulse signal generating circuit 3. The operation of the actual fuse circuit block 2 of the present embodiment is in itself the same as that of the prior art fuse circuit 102.

Figure 11:
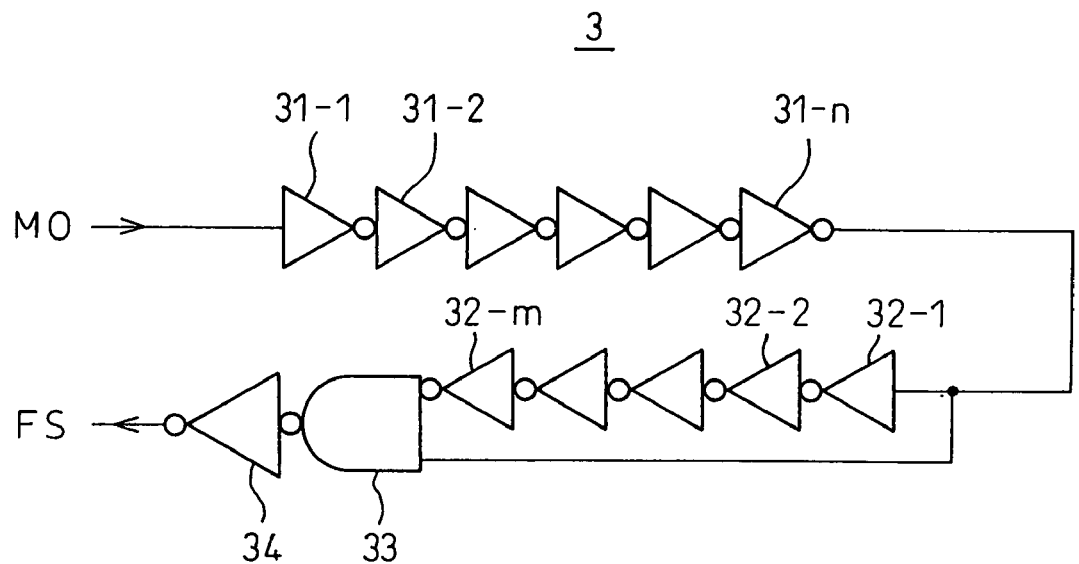
FIG. 11 is a circuit diagram showing one example of a pulse signal generating circuit in the semiconductor integrated circuit device of FIG. 8.

FIG. 11 is a circuit diagram showing one example of the pulse signal generating circuit in the semiconductor integrated circuit device of FIG. 8. The pulse signal generating circuit 3 of the present embodiment shown in FIG. 11 has the same circuit configuration as that of the prior art pulse signal generating circuit 103 previously shown in FIG. 4.

That is, as shown in FIG. 11, the pulse signal generating circuit 3 comprises a plurality (even number) of inverters 31-1 to 31-n, a plurality (odd number) of inverters 32-1 to 32-m, a NAND gate 33, and an inverter 34. Here, the inverters 31-1 to 31-n are provided to give a delay time DT1, while the inverters 32-1 to 32-m are provided to give a pulse width DT2 in the capture signal FS, as will be shown in FIG. 14, to be described later.

Figure 12:
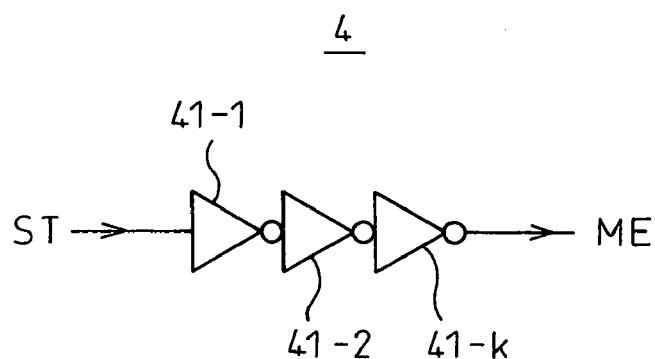
FIG. 12 is a circuit diagram showing one example of a starter signal delay circuit in the semiconductor integrated circuit device of FIG. 8.

FIG. 12 is a circuit diagram showing one example of the starter signal delay circuit in the semiconductor integrated circuit device of FIG. 8.

As is apparent from FIG. 12, the starter signal delay circuit 4 of the present embodiment comprises a plurality (odd number) of inverters 41-1 to 41-k; these inverters 41-1 to 41-k are provided to give a delay time DT3 in FIG. 14 to be described later.

Figure 13:
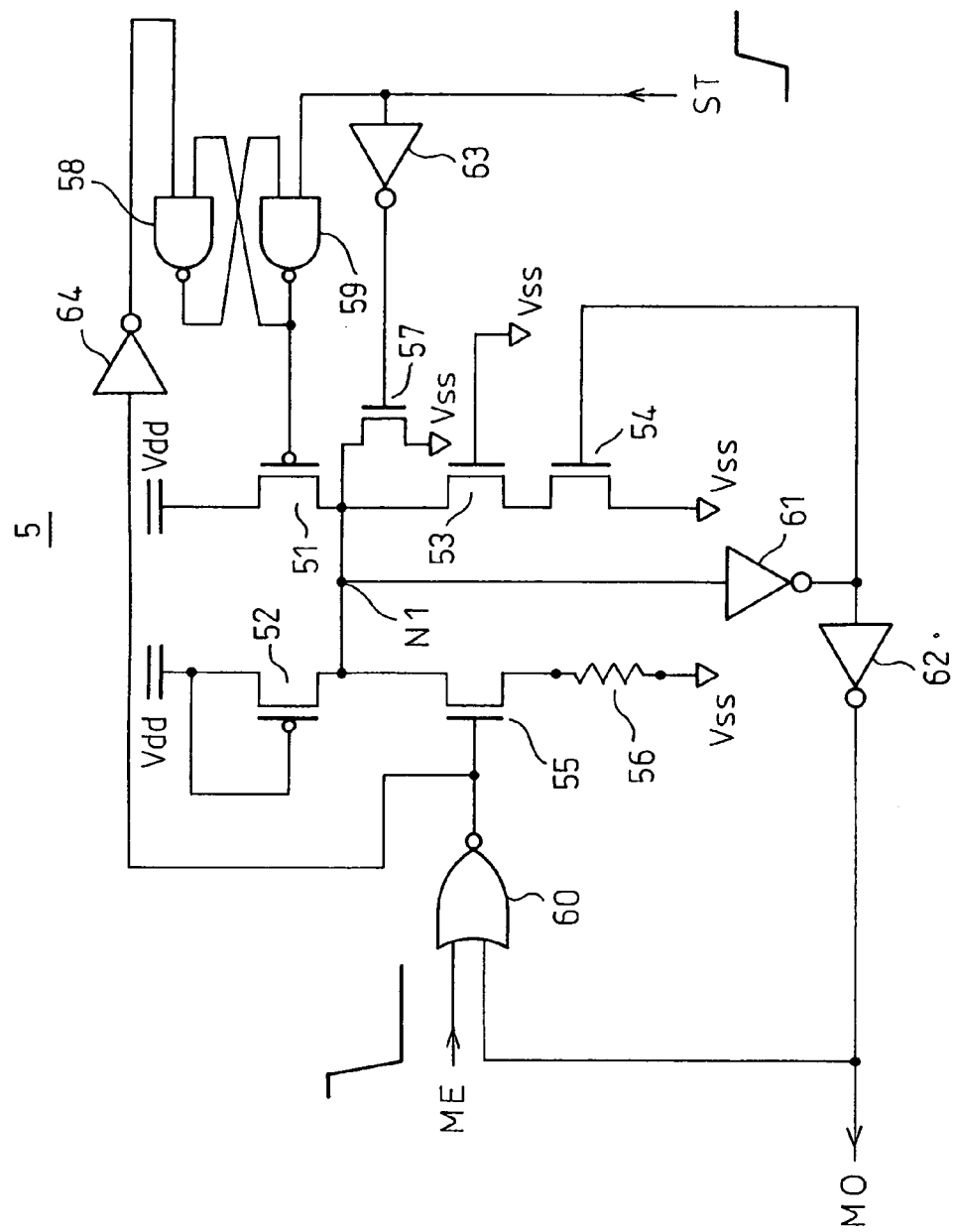
FIG. 13 is a circuit diagram showing one example of a fuse monitor circuit in the semiconductor integrated circuit device of FIG. 8.

FIG. 13 is a circuit diagram showing one example of the fuse monitor circuit in the semiconductor integrated circuit device of FIG. 8.

As shown in FIG. 13, the fuse monitor circuit 5 of the present embodiment comprises PMOS transistors 51 and 52, nMOS transistors 53 to 55 and 57, a resistor 56, NAND gates 58 and 59, a NOR gate 60, and inverters 61 to 64. Here, the NAND gates 58 and 59 form a latch, and the resistor 56 is chosen to have a prescribed resistance value in order to function as a replica of the fuse 26 in the actual fuse circuit block 2. Here, the resistance value of the resistor 56 is set so as to match the characteristic of the actual fuse (in the actual fuse circuit block); in a specific example, where inversion takes place when the supply voltage is 1.2 V and the resistance value of the actual fuse is larger than 100 kΩ, the resistance value of the resistor 56 is set to 100 kΩ. That is, the resistor 56 in the fuse monitor circuit 5 is chosen to have a resistance value smaller, by a comfortable margin, than the smallest value of the resistance of the blown fuse (26) in the actual fuse circuit block 2 (for example, the resistance value of the blown fuse whose resistance has become the smallest due to the effects of growback or the like).

First, as is apparent from a comparison of FIG. 13 and FIG. 10, the pMOS transistors 51 and 52, the nMOS transistors 53 to 55, and the inverters 61 and 62 in the fuse monitor circuit 5 of the present embodiment substantially correspond to the pMOS transistors 21 and 22, the nMOS transistors 23 to 25, and the inverters 27 and 28, respectively, in the actual fuse circuit block 2 shown in FIG. 10. However, in the fuse monitor circuit 5, the gate of the PMOS transistor 52 is connected to the high-level power supply line (Vdd), while the gate of the nMOS transistor 53 is connected to the low-level power supply line (Vss); further, the gate of the nMOS transistor 55 is supplied with an output signal of the NOR gate 60 whose one input is coupled to the output signal MO and whose other input is coupled to an output signal (fuse monitor circuit enable signal) ME of the starter signal delay circuit 4.

The output signal of the NOR gate 60 is also input via the inverter 64 to the latch formed by the NAND gates 58 and 59 to which the starter signal ST is also input, and the output of the latch is supplied to the gate of the PMOS transistor 51. To a connection node, between the transistors 51 and 53, is connected the drain of the nMOS transistor 57 whose gate is supplied with a signal created by inverting the starter signal ST through the inverter 63. The source of this transistor 57 is connected to the low-level power supply line (Vss). Here, the pMOS transistor 52 and the nMOS transistors 53 and 54 are not directly concerned with the operation of the fuse monitor circuit 5 but, by constructing the fuse monitor circuit 5 to have a configuration equivalent to that of the actual fuse circuit block 2, the effects of parasitic capacitances, etc. in the fuse monitor circuit are made to match those in the actual fuse circuit block.

Figure 14:
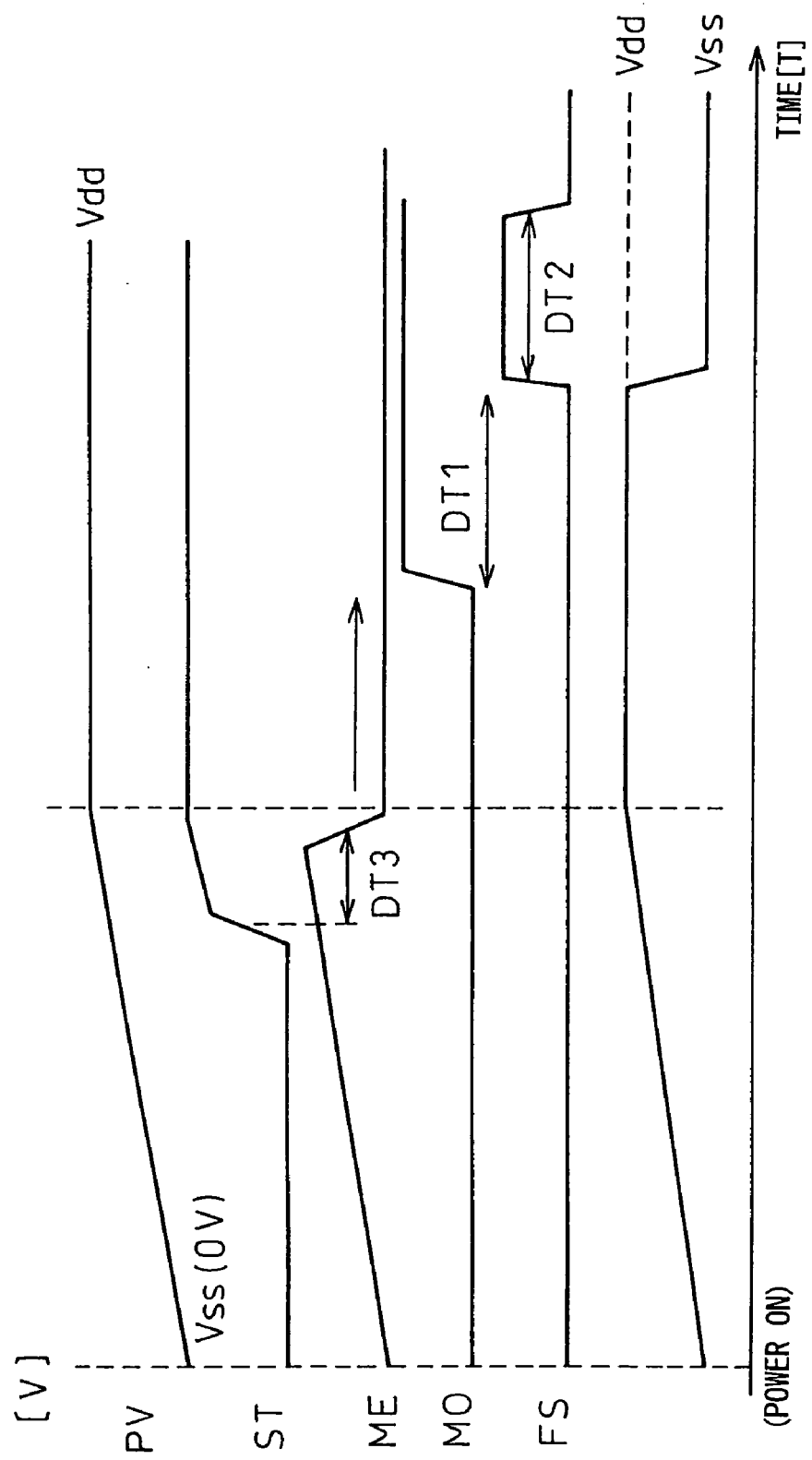
FIG. 14 is a waveform diagram for explaining the operation of the semiconductor integrated circuit device of FIG. 8.

FIG. 14 is a waveform diagram for explaining the operation of the semiconductor integrated circuit device of FIG. 8.

As shown in FIGS. 14 and 13, first, when power is turned on to the semiconductor integrated circuit device, the actual supply voltage PV gradually rises from Vss (0 V) and finally settles at the steady-state supply voltage Vdd; during this process, the starter signal ST changes from a low level "L" to a high level "H". In the fuse monitor circuit 5, first, when the starter signal ST is at the low level "L", the nMOS transistor 57 is turned on as the supply voltage VP rises, and the potential at the node N1 is thus reset (initialized) to the low level "L" (Vss). Then, when the starter signal ST changes to the high level "H", and the output of the inverter 63 thus changes to the low level "L", the transistor 57 turns off. The nMOS transistor 53, whose gate is supplied with the low-level supply voltage (Vss), and the pMOS transistor 53, whose gate is supplied with the high-level supply voltage (Vdd), are held in the off state at all times; these transistors, as well as the nMOS transistor 54, are not directly concerned with the operation of the fuse monitor circuit 5 but, as previously described, with the gate capacitances, etc. of these transistors, the fuse monitor circuit 5 can reproduce the operation of the actual fuse circuit block 2.

The starter signal delay circuit 4, which comprises the plurality (odd number) of inverters 41-1 to 41-k, inverts the starter signal ST and produces the output signal ME; this output signal ME falls with a delay of delay time DT3 relative to the rise timing of the starter signal ST. This signal (fuse monitor circuit enable signal) ME is supplied to one input of the NOR gate 60, and at this time, since the output signal MO is at the low level "L" (Vss), when the signal ME falls the output of the NOR gate 60 goes to the high level "H" (Vdd), causing the transistor 55 to turn on. The output of the NOR gate 60 is also supplied via the inverter 64 to one input of the NAND gate 58; here, since the starter signal ST supplied to one input of the NAND gate 59 is at the high level "H", the output of the latch (58, 59) is held at the low level "L", so that the transistor 51 remains ON.

Accordingly, the current from the high-level power supply line (Vdd) flows through the ON transistor 51, and thus the current flows to the low-level power supply line (Vss) via the ON transistor 55 and the resistor 56. Then, with the rising of the actual supply voltage VP, and due to the correlation between the driving capability (ON resistance) of the pMOS transistor 51 and the resistance value of the resistor 56, the potential at the node N1 gradually rises to the high level "H" (Vdd), and thus the output signal MO, output through the inverters 61 and 62, changes to the high level "H" (Vdd). That is, when the blown state of the fuse 26 in the actual fuse circuit block 2 is reproduced (for example, the condition in which the resistance value of the blown fuse 26 has decreased to 100 kΩ due to growback or the like is reproduced), the potential at the node N1 goes to the high level "H" when the actual supply voltage VP has risen up to the voltage at which the fuse can be correctly judged to be in the blown state. Thereupon, the output of the NOR gate 60 changes to the low level "L", causing the transistor 55 to turn off; after that, the output signal MO remains at the high level "H".

In this way, the output signal MO of the fuse monitor circuit 5 changes from the low level "L" to the high level "H" immediately after the actual supply voltage VP has risen to the voltage at which the blown fuse 26 in the actual fuse circuit block 2 can be correctly judged to be in the blown state, after considering growback, etc.

The output signal MO of the fuse monitor circuit 5 is supplied to the pulse signal generating circuit 3, which then outputs the capture signal FS. Here, in the present embodiment, the output signal MO of the fuse monitor circuit 5, which is supplied to the pulse signal generating circuit 3, corresponds, for example, to the starter signal st supplied to the pulse signal generating circuit 103 in the prior art semiconductor integrated circuit device shown in FIG. 1. Accordingly, the capture signal FS of the present embodiment is output at a timing at which the blown/unblown state of the fuse 26 in the actual fuse circuit block 2 can be correctly judged.

In the above configuration, if any set value in the fuse monitor circuit 5 is to be changed (for example, the resistance value of the blown fuse 26 due to growback or the like, which is set to 100 kΩ), this can be accomplished by changing the resistance value of the resistor 56, but instead, the driving capability of the PMOS transistor 57, for example, may be changed by changing its gate width or gate length.

Figure 15:
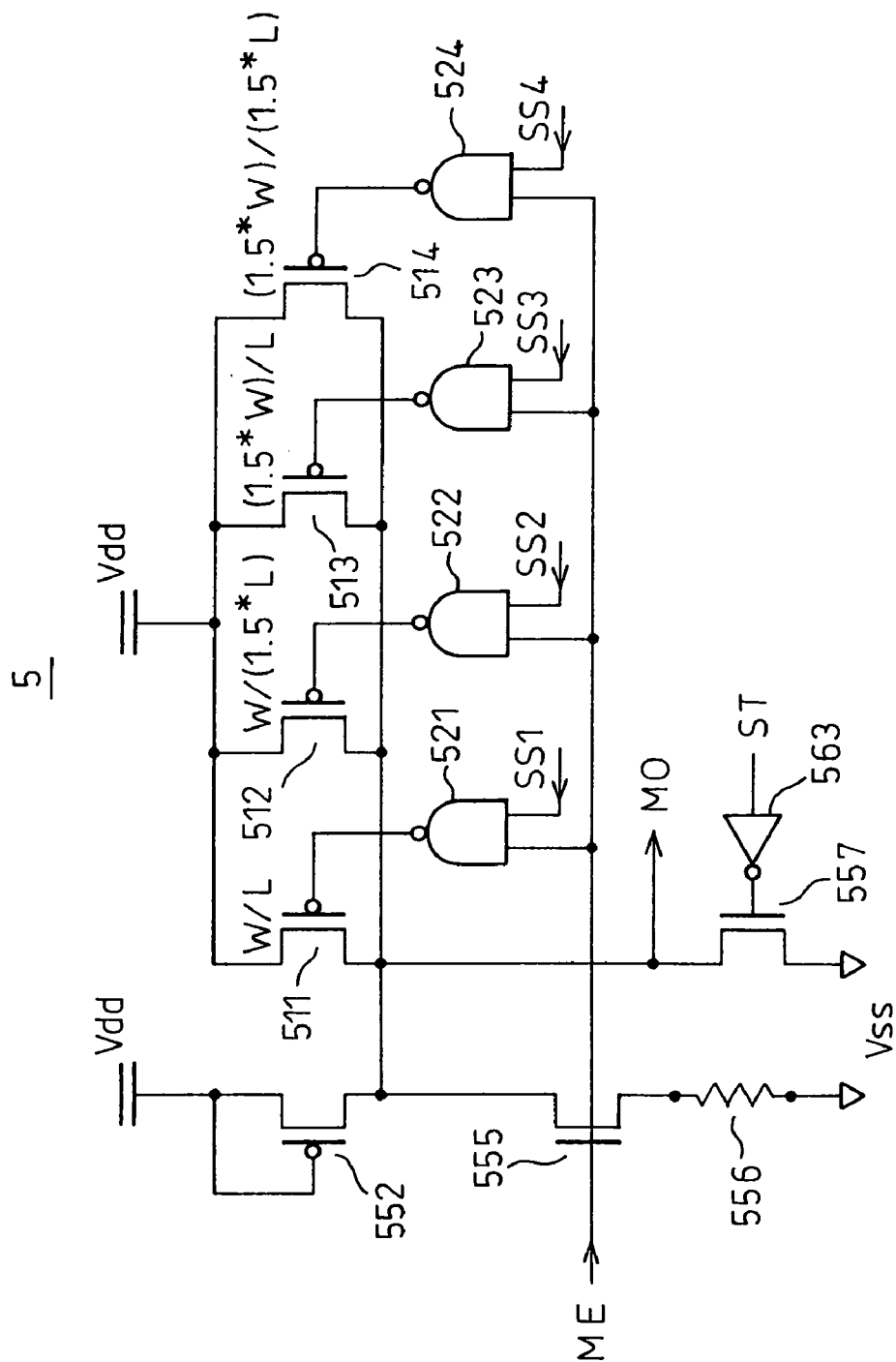
FIG. 15 is a diagram showing a modified example of the fuse monitor circuit of FIG. 13.

FIG. 15 is a diagram showing a modified example of the fuse monitor circuit of FIG. 13; in this modified example, the pMOS transistor 51 in the fuse monitor circuit of FIG. 13 is replaced by a plurality of PMOS transistors 511 to 514 having different driving capabilities, from which a suitable one or ones are selected for use.

As shown in FIG. 15, the fuse monitor circuit 5 of the modified example comprises PMOS transistors 552 and 511 to 514, nMOS transistors 555 and 557, a resistor 556, NAND gates 521 to 524, and an inverter 563. Here, the pMOS transistors 511 to 514 differ in driving capability (transistor size); for example, when the gate width and gate length of the pMOS transistor 511 are denoted by W and L, respectively, then the gate width and gate length of the pMOS transistor 512 are chosen to be W and 1.5×L, respectively, the gate width and gate length of the pMOS transistor 513 are chosen to be 1.5×W and L, respectively, and the gate width and gate length of the pMOS transistor 514 are chosen to be 1.5×W and 1.5×L, respectively.

Selection from among the PMOS transistors 511 to 514 is made, for example, by setting a test mode and by determining the most desirable state by sequentially switching, in the test mode, the select signals SS1 to SS4 each to be input to one terminal of a corresponding one of the NAND gates 521 to 524 associated with the respective transistors 511 to 514. The other input of each of the NAND gates 521 to 524 is supplied with the fuse monitor enable signal ME (the output signal of the starter signal delay circuit 4). Here, it will be appreciated that the number of transistors to be selected from among the pMOS transistors 511 to 514 is not limited to one, but a plurality of transistors (for example, the pMOS transistors 511 and 512) may be selected.

Figure 16:
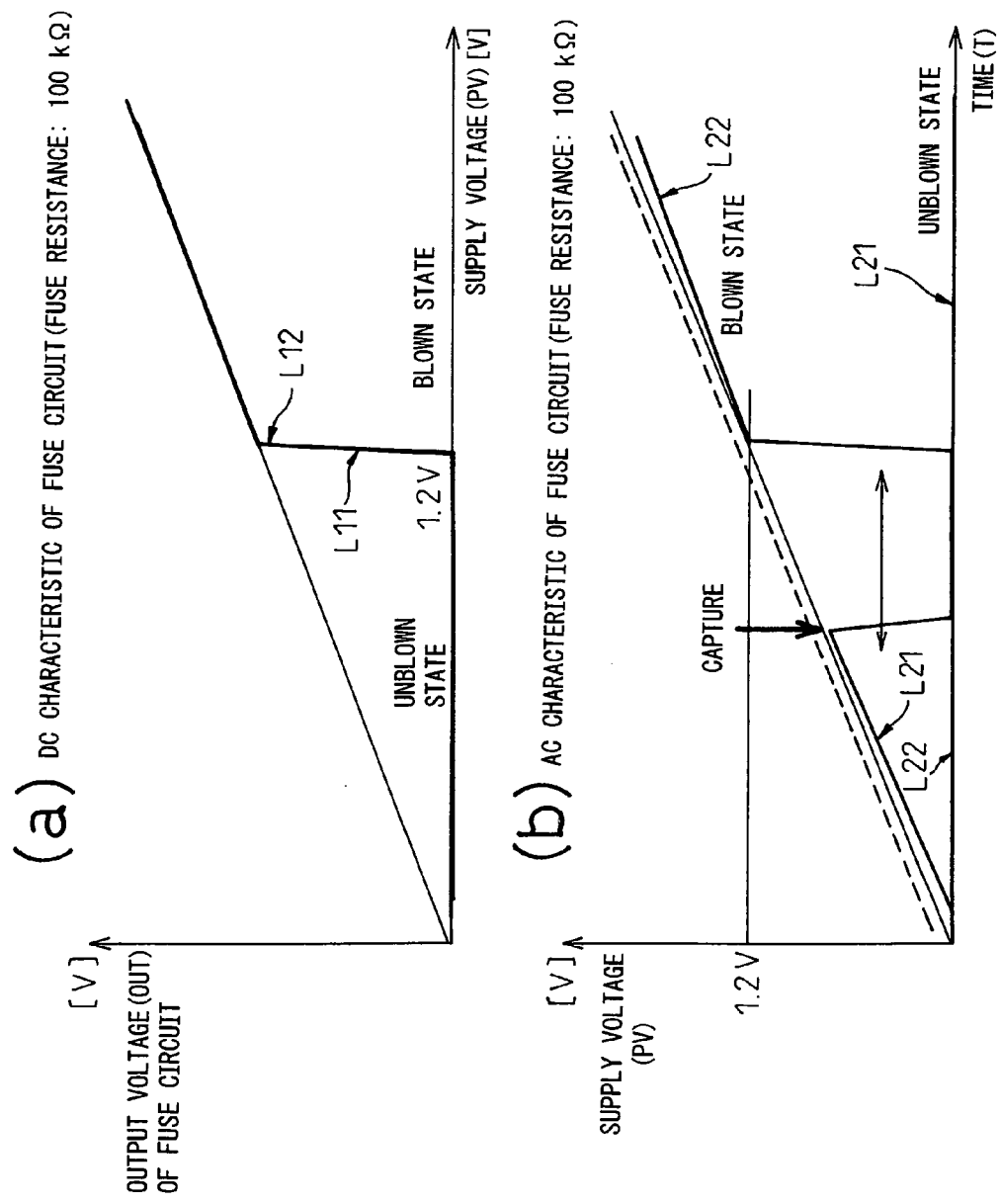
FIG. 16 is a diagram (part 1) showing the DC characteristic and AC characteristic of the fuse circuit according to the present invention.

FIG. 16 is a diagram (part 1) showing the DC characteristic and AC characteristic of the fuse circuit according to the present invention: FIG. 16(a) and FIG. 16(b) show the DC characteristic and the AC characteristic, respectively, of the fuse circuit when the characteristic (the resistance value of the resistor 56) of the fuse monitor circuit 5 is made to match the characteristic (the resistance value of the blown fuse 26) of the actual fuse circuit block 2. In FIG. 16(a), the characteristic curve L11 of the actual fuse circuit block and the characteristic curve L12 of the fuse monitor circuit substantially coincide with each other.

As shown in FIG. 16(a) and FIG. 16(b), the DC characteristic (L12) of the fuse monitor circuit 5 is the same as the DC characteristic (L11) of the actual fuse circuit block 2, but the AC characteristic (L22) of the fuse monitor circuit 5 differs because the reset state is the unblown state. In FIG. 16(b), the curve L21 corresponds to the characteristic curve of FIG. 7(b).

If the fuse monitor circuit 5 is started at a voltage lower than the inversion voltage (for example, 1.2 V), the output state does not change, and therefore, the monitoring is not terminated. That is, after power is turned on to the semiconductor integrated circuit device, when the actual supply voltage (VP) rises and exceeds the inversion voltage, causing the output signal MO of the fuse monitor circuit 5 to invert, the monitoring by the fuse monitor circuit 5 is completed.

In response to the completion of the monitoring (for example, the output signal MO of the fuse monitor circuit 5 shown in FIGS. 13 and 14 rises from the low level "L" to the high level "H"), capturing of the fuse information in the actual fuse circuit block 2 is initiated. In this way, when power is turned on to the semiconductor integrated circuit device, and the actual supply voltage PV rises, the fuse information can be captured correctly during the short period of time that follows the power on.

Figure 17:
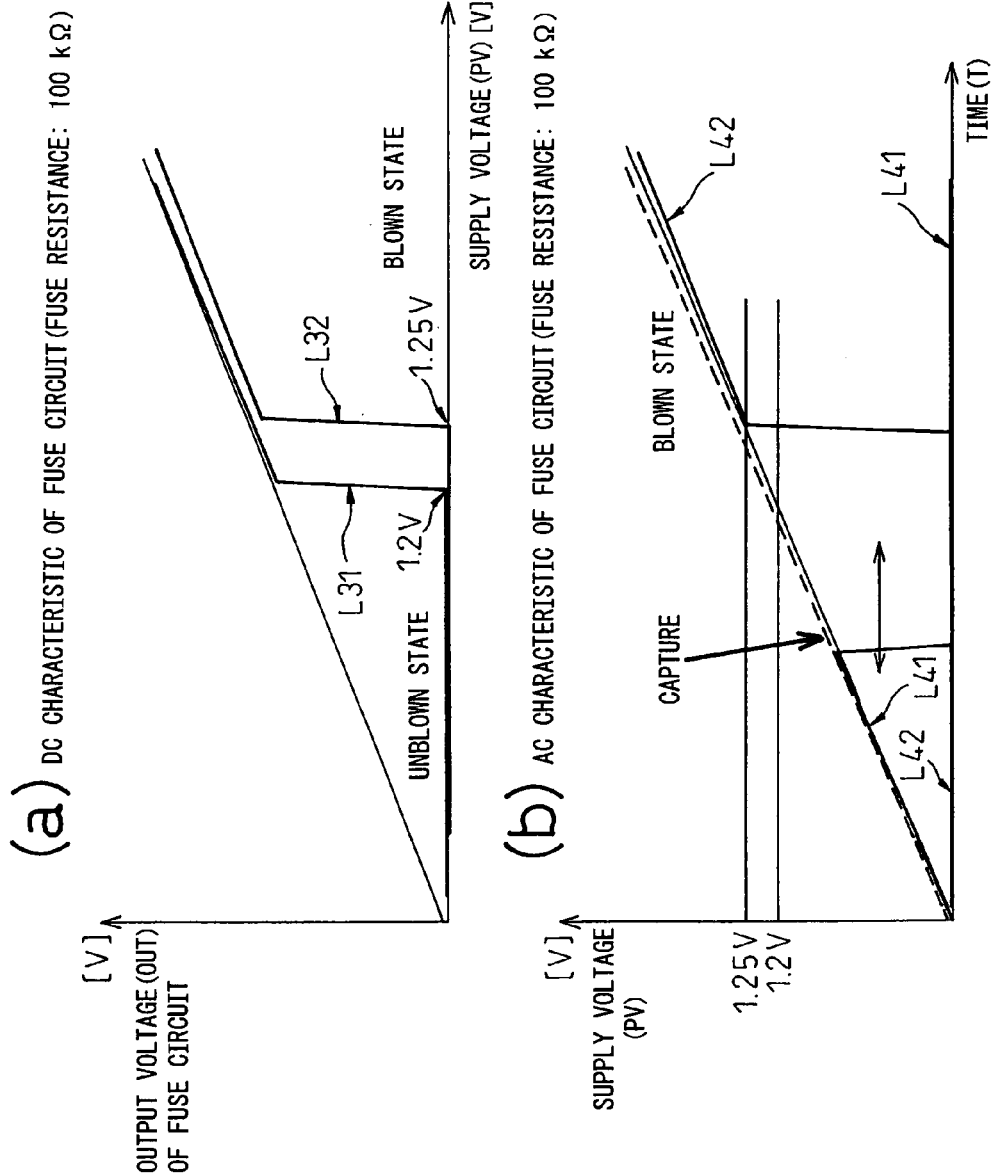
FIG. 17 is a diagram (part 2) showing the DC characteristic and AC characteristic of the fuse circuit according to the present invention.

FIG. 17 is a diagram (part 2) showing the DC characteristic and AC characteristic of the fuse circuit according to the present invention: FIG. 17(a) and FIG. 17(b) show the DC characteristic and the AC characteristic, respectively, of the fuse circuit when the monitoring characteristic is made worse (for example, when the resistance value of the resistor 56 in the fuse monitor circuit 5 is set smaller (for example, to 50 kΩ) than the resistance value of the blown fuse 26 in the actual fuse circuit block 2).

As shown in FIG. 17(a) and FIG. 17(b), the DC characteristic (L32) of the fuse monitor circuit 5 is shifted to the right (the higher voltage side) of the DC characteristic (L31) of the actual fuse circuit block 2, and the AC characteristic (L42) of the fuse monitor circuit 5 shows the blown state when the voltage exceeds the inversion voltage (for example, 1.25 V). In FIG. 17(b), the curve L41 corresponds to the characteristic curve of FIG. 7(b).

That is, FIG. 17(a) and FIG. 17(b) show the case where, by worsening the monitoring characteristic of the fuse monitor circuit, the inversion voltage is increased (for example, from 1.2 V to 1.25 V) to provide a greater margin in the capturing operation of the actual fuse (26). The setting of the above monitoring characteristic is made by reducing the resistance value of the resistor 56 in the fuse monitor circuit 5, or by increasing the gate length L (or reducing the gate width W) of the pMOS transistor 51, as previously described.

In the above setting, the monitor inversion voltage in the fuse monitor circuit 5 increases from 1.2 V to 1.25 V (the inversion voltage for the actual fuse 26 is 1.2 V); therefore, if the fuse monitor circuit 5 is started at a lower voltage, the process waits until the voltage rises to the inversion voltage (1.25 V). Since the output voltage MO of the fuse monitor circuit 5 rises from the low level "L" to the high level "H" after the actual supply voltage (PV) has exceeded the inversion voltage (1.25 V), errors become less likely to occur in the fuse information captured by the actual fuse circuit block 2.

As described in detail above, according to the present invention, a fuse circuit and a semiconductor integrated circuit device can be provided that can correctly capture fuse information even at a low operating voltage and can also achieve reliable latching by a latch circuit.

What is claimed is:

1. A fuse circuit comprising:
   an actual fuse circuit block for storing fuse information; and
   a fuse monitor circuit for monitoring whether a supply voltage has reached an information capturable voltage at which the fuse information from the actual fuse circuit block can be correctly captured.

2. The fuse circuit as claimed in claim 1, wherein the capturing of the fuse information by the actual fuse circuit block is performed after it is determined by the fuse monitor circuit that the supply voltage has reached the information capturable voltage.

3. The fuse circuit as claimed in claim 1, wherein a fuse characteristic that the fuse monitor circuit has with respect to the supply voltage is made opposite to a fuse characteristic that the actual fuse circuit block has with respect to the state of a fuse.

4. The fuse circuit as claimed in claim 3, wherein
the actual fuse circuit block has the fuse characteristic such that the information is inverted to an unblown state side if the fuse is not blown, but remains at a blown state side if the fuse is blown, and
the fuse monitor circuit has a fuse characteristic such that the information is inverted to the blown state side if the supply voltage is higher than or equal to the information capturable voltage, but remains at the unblown state side if the supply voltage is lower than the information capturable voltage.

5. The fuse circuit as claimed in claim 1, wherein the fuse monitor circuit has a circuit configuration corresponding to the actual fuse circuit block, and uses a resistor to represent the fuse in the actual fuse circuit block.

6. The fuse circuit as claimed in claim 5, wherein the resistor in the fuse monitor circuit is chosen to have a resistance value that is determined by considering the resistance value of a blown fuse in the actual fuse circuit block.

7. The fuse circuit as claimed in claim 6, wherein the resistor in the fuse monitor circuit is chosen to have a resistance value smaller than the smallest value of the resistance of the blown fuse in the actual fuse circuit block.

8. The fuse circuit as claimed in claim 5, wherein the fuse monitor circuit sets the information capturable voltage by adjusting the resistance value of the resistor used in the fuse monitor circuit to represent the fuse.

9. The fuse circuit as claimed in claim 5, wherein the fuse monitor circuit sets the information capturable voltage by adjusting the size of a transistor corresponding to a transistor used in the actual fuse circuit block to flow a current to the fuse.

10. The fuse circuit as claimed in claim 9, wherein a plurality of transistors of different sizes are provided from which to select the transistor whose size is to be adjusted in the fuse monitor circuit, and at least one transistor is selected in a test mode from among the plurality of transistors.

11. The fuse circuit as claimed in claim 1, wherein the fuse monitor circuit is used to capture the fuse information from the actual fuse circuit block when power is turned on to a semiconductor integrated circuit device in which the fuse circuit is provided.

12. The fuse circuit as claimed in claim 1, wherein the fuse monitor circuit produces an output signal at a point where a starter signal is cut off.

13. The fuse circuit as claimed in claim 12, wherein the actual fuse circuit block uses the output signal of the fuse monitor circuit as a capture signal.

14. The fuse circuit as claimed in claim 1, wherein the fuse monitor circuit has a function for stopping, after completion of the monitoring, a signal with which the monitoring was initiated.

15. A semiconductor integrated circuit device comprising:
an actual fuse circuit block for storing fuse information;
a starter signal generating circuit for generating a starter signal that is used to capture the fuse information when power is turned on;
a fuse monitor circuit for monitoring whether a supply voltage has reached an information capturable voltage at which the fuse information from the actual fuse circuit block can be correctly captured; and
a pulse signal generating circuit for generating a capture signal from an output signal of the fuse monitor circuit, wherein
the actual fuse circuit block receives the capture signal from the pulse signal generating circuit and the starter signal, and thereby outputs the fuse information.

16. The semiconductor integrated circuit device as claimed in claim 15, wherein the capturing of the fuse information by the actual fuse circuit block is performed after it is determined by the fuse monitor circuit that the supply voltage has reached the information capturable voltage.

17. The semiconductor integrated circuit device as claimed in claim 15, wherein a fuse characteristic that the fuse monitor circuit has with respect to the supply voltage is made opposite to a fuse characteristic that the actual fuse circuit block has with respect to the state of a fuse.

18. The semiconductor integrated circuit device as claimed in claim 17, wherein
the actual fuse circuit block has the fuse characteristic such that the information is inverted to an unblown state side if the fuse is not blown, but remains at a blown state side if the fuse is blown, and
the fuse monitor circuit has a fuse characteristic such that the information is inverted to the blown state side if the supply voltage is higher than or equal to the information capturable voltage, but remains at the unblown state side if the supply voltage is lower than the information capturable voltage.

19. The semiconductor integrated circuit device as claimed in claim 15, wherein the fuse monitor circuit has a circuit configuration corresponding to the actual fuse circuit block and uses a resistor to represent the fuse in the actual fuse circuit block.

20. The semiconductor integrated circuit device as claimed in claim 19, wherein the resistor in the fuse monitor circuit is chosen to have a resistance value that is determined by considering the resistance value of a blown fuse in an actual fuse circuit block.

21. The semiconductor integrated circuit device as claimed in claim 20, wherein the resistor in the fuse monitor circuit is chosen to have a resistance value smaller than the smallest value of the resistance of the blown fuse in an actual fuse circuit block.

22. The semiconductor integrated circuit device as claimed in claim 19, wherein the fuse monitor circuit sets the information capturable voltage by adjusting the resistance value of the resistor used in the fuse monitor circuit to represent the fuse.

23. The semiconductor integrated circuit device as claimed in claim 19, wherein the fuse monitor circuit sets the information capturable voltage by adjusting the size of a transistor corresponding to a transistor used in the actual fuse circuit block to flow a current to the fuse.

24. The semiconductor integrated circuit device as claimed in claim 23, wherein a plurality of transistors of different sizes are provided from which to select the transistor whose size is to be adjusted in the fuse monitor circuit, and at least one transistor is selected in a test mode from among the plurality of transistors.

25. The semiconductor integrated circuit device as claimed in claim 15, wherein the fuse monitor circuit produces the output signal at a point where the starter signal is cut off.

26. The semiconductor integrated circuit device as claimed in claim 25, wherein the actual fuse circuit block uses the output signal of the fuse monitor circuit as the capture signal.

27. The semiconductor integrated circuit device as claimed in claim 15, wherein the fuse monitor circuit has a function of stopping, after completion of the monitoring, a signal with which the monitoring was initiated.

* * * * *